(12) United States Patent
Shirakawa et al.

(10) Patent No.: US 6,644,964 B2
(45) Date of Patent: Nov. 11, 2003

(54) SUBSTRATE PROCESSING APPARATUS AND SUBSTRATE PROCESSING METHOD

(75) Inventors: Eiichi Shirakawa, Kikuchi-Gun (JP); Toshichika Takei, Kikuchi-Gun (JP)

(73) Assignee: Tokyo Electron Limited, Tokyo-To (JP)

( * ) Notice: Subject to any disclaimer, the term of this patent is extended or adjusted under 35 U.S.C. 154(b) by 55 days.

(21) Appl. No.: 09/883,198

(22) Filed: Jun. 19, 2001

(65) Prior Publication Data

US 2001/0053508 A1 Dec. 20, 2001

(30) Foreign Application Priority Data

Jun. 20, 2000 (JP) .......................................... 2000-185118

(51) Int. Cl.[7] .............................................. F27D 5/00
(52) U.S. Cl. ...................... 432/253; 432/152; 432/258; 118/728; 392/418
(58) Field of Search ............................ 432/152, 6, 241, 432/253, 258, 259; 118/724, 725, 728, 500; 392/418

(56) References Cited

U.S. PATENT DOCUMENTS

| | | | |
|---|---|---|---|
| 4,738,748 A | * | 4/1988 | Kisa ........................ 156/345.27 |
| 5,665,166 A | * | 9/1997 | Deguchi et al. .......... 118/723 E |
| 5,665,167 A | * | 9/1997 | Deguchi et al. .......... 118/723 E |
| 5,704,493 A | * | 1/1998 | Fujikawa et al. ............. 118/500 |
| 6,099,645 A | * | 8/2000 | Easley et al. ................ 118/500 |
| 6,214,184 B1 | * | 4/2001 | Chien et al. ................. 118/728 |

OTHER PUBLICATIONS

U.S. patent application Ser. No. 10/151,968, filed May 22, 2002, pending.

* cited by examiner

*Primary Examiner*—Jiping Lu
(74) *Attorney, Agent, or Firm*—Oblon, Spivak, McClelland, Maier & Neustadt, P.C.

(57) ABSTRACT

A heating processing chamber has a plate for holding a wafer and a heater heating the plate portion. The plate portion is composed of a plurality of divided plates separated from each other, and thereby the plate is hard to break even through a drastic change in temperature, thus making it possible to increase the durability of the plate.

20 Claims, 14 Drawing Sheets

SUBSTRATE PROCESSING APPARATUS AND SUBSTRATE PROCESSING METHOD

BACKGROUND OF THE INVENTION

1. Field of the Invention

The present invention relates to a technical field of a substrate processing apparatus for performing heat processing and cool processing for substrates such as semiconductor wafers and the like.

2. Description of the Related Art

In semiconductor device fabrication, for example, a layer insulation film is formed by, for example, an SOD (Spin on Dielectric) system. In the SOD system, a wafer is spin-coated with a coating film, and chemical processing, heat-processing, or the like is applied thereto, whereby a layer insulation film is formed.

When a layer insulation film is formed by, for example, a sol-gel method, an insulation film material, for example, a solution in which colloids of TEOS (tetraethoxysilane) are dispersed in an organic solvent is supplied onto a semiconductor wafer (hereinafter called "the wafer") at first. Next, gelling processing is performed for the wafer supplied with the solution, and then replacement of the solvent is performed. Subsequently, the wafer with the solvent being replaced is heat-processed.

In these series of process steps, various kinds of heat-processing are performed. These kinds of heat-processing are generally performed by placing a wafer on a plate for heat-processing, however, when a wafer is directly placed on the plate, the wafer is adversely affected by static electricity. For this and other reasons, a wafer is heat-processed with a gap being formed between the wafer and the plate by a gap forming member being placed on the plate.

Since an outside air enters a processing chamber when a wafer is carried into and out of the processing chamber, the processing chamber in which the plate is placed varies in temperature by about 100° C. Therefore, the plate made of ceramics repeatedly expands and shrinks, whereby the plate is extremely worn out and sometimes cracks.

SUMMARY OF THE INVENTION

An object of the present invention is to provide a substrate processing apparatus in which a plate with less occurrence of cracking and increased durability is placed.

In order to solve the problem, a substrate processing apparatus of the present invention comprises a plate portion having a plurality of divided plates holding a substrate, and a heater heat-processing the substrate held by said plate portion.

According to the above structure of the present invention, the plate portion is formed by a plurality of divided plates, thus making the plate hard to break even through a drastic change in temperature, and increasing durability.

Another substrate processing apparatus of the present invention comprises a first plate portion having a plurality of divided and separated plates with a first space from each other and placed horizontally with a substrate, the first plate portion has a first surface and a second surface, the first surface holding the substrate, a heater for heat-processing the substrate held by the plate, and a gas supply mechanism supplying a first gas to the substrate through a first space between the adjacent divided plates of the first plate portion.

The apparatus further comprises a second plate portion having a plurality of divided and separated plates with a second space from each other and placed horizontally with the substrate and it is provided so that the substrate is being placed between the first plate portion and the second plate portion.

According to the above structure of the present invention, since a plurality of spaces are provided in the plate, the gas is supplied to the substrate through these spaces, therefore the gas is supplied to the wafer W uniformly throughout the surface.

According to one embodiment of the present invention, the apparatus further comprises a plurality of support members disposed so as to be inserted through the first space, holding the substrate with the predetermined space therefrom.

According to the above structure, with the structure in which the support members support the substrate, the load of the substrate is not exerted on the plate, thus making it possible to form the thickness of the plate to be thin to the limit. As a result, the plate can be formed to be thin, and thereby time taken to raise the temperature of the plate can be shortened, making it possible to reduce thermal capacity and contribute to energy conservation.

Further, for example, when the aforementioned gas is supplied to cool the substrate, the gas is supplied to the substrate through each space of the thin divided plates, and thereby the distance the gas flows through the space can be shorter in a thinner plate than a thicker plate, making it possible to reduce the flow of the gas and contribute to energy conservation.

According to one embodiment of the present invention, the thickness of the plate is 0.5 mm to 2.0 mm.

According to one embodiment of the present invention, the first space is formed to be gradually larger toward downstream compared to upstream where the first gas is supplied.

According to the above structure, uniform cool processing can be performed for the entire surface of the wafer W.

According to one embodiment of the present invention, surface areas of the divided plates of the first plate portion are formed to be gradually smaller toward downstream compared to upstream where the gas is supplied.

According to the above structure, uniform cool processing can be performed for the entire surface of the wafer W.

According to one embodiment of the present invention, the apparatus further comprises film members disposed attachably and detachably in the first space, having a plurality of holes.

According to the above structure, for example, by preparing two or more film members with a plurality of holes with different diameters, the supply of the gas to the substrate can be controlled by replacing them properly.

According to one embodiment of the present invention, the apparatus further comprises a guide member disposed at the second surface of the first plate portion guiding the supplied first gas into the first space.

According to the above structure, the gas can be supplied efficiently to the substrate.

According to one embodiment of the present invention, the guide member has a curving portion that gradually approaches the second surface of the first plate portion.

According to the above structure, for example, the temperature of the gas rises to an extent by the heat from the plate as the gas flows from upstream of the gas supply toward downstream, but the flow of the gas supplied to the substrate can be made larger toward downstream. Accordingly, uniform cool processing can be performed to the entire surface of the substrate.

Further, a substrate processing method of the invention comprises, holding a substrate on a first plate portion having a plurality of divided plates placed with a space from each other, heat-processing the substrate on the first plate portion, and separating the substrate from the first plate portion and supplying a first cooling gas to the separated substrate through a first spaces.

These objects and still other objects and advantages of the present invention will become apparent upon reading the following specification when taken in conjunction with the accompanying drawings.

BRIEF DESCRIPTION OF THE DRAWINGS

FIG. 8 is a schematic sectional view of a substrate processing apparatus according to a second embodiment of the invention.

DETAILED DESCRIPTION OF THE PREFERRED EMBODIMENT

Hereinafter, embodiments of the present invention will be explained with reference to the drawings.

Figure 1:
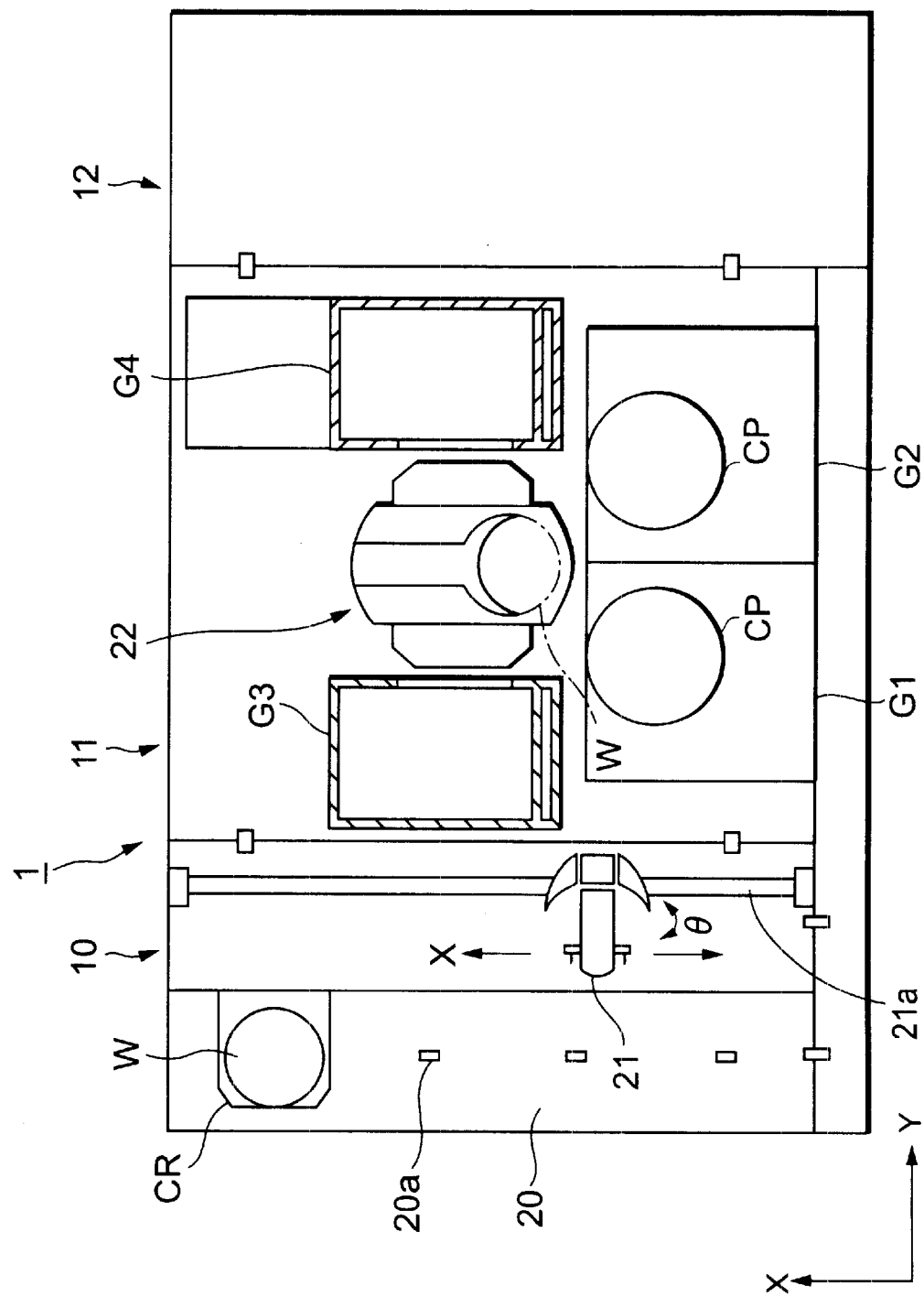
FIG. 1 is a plan view of an SOD system according to an embodiment of the present invention.
Figure 2:
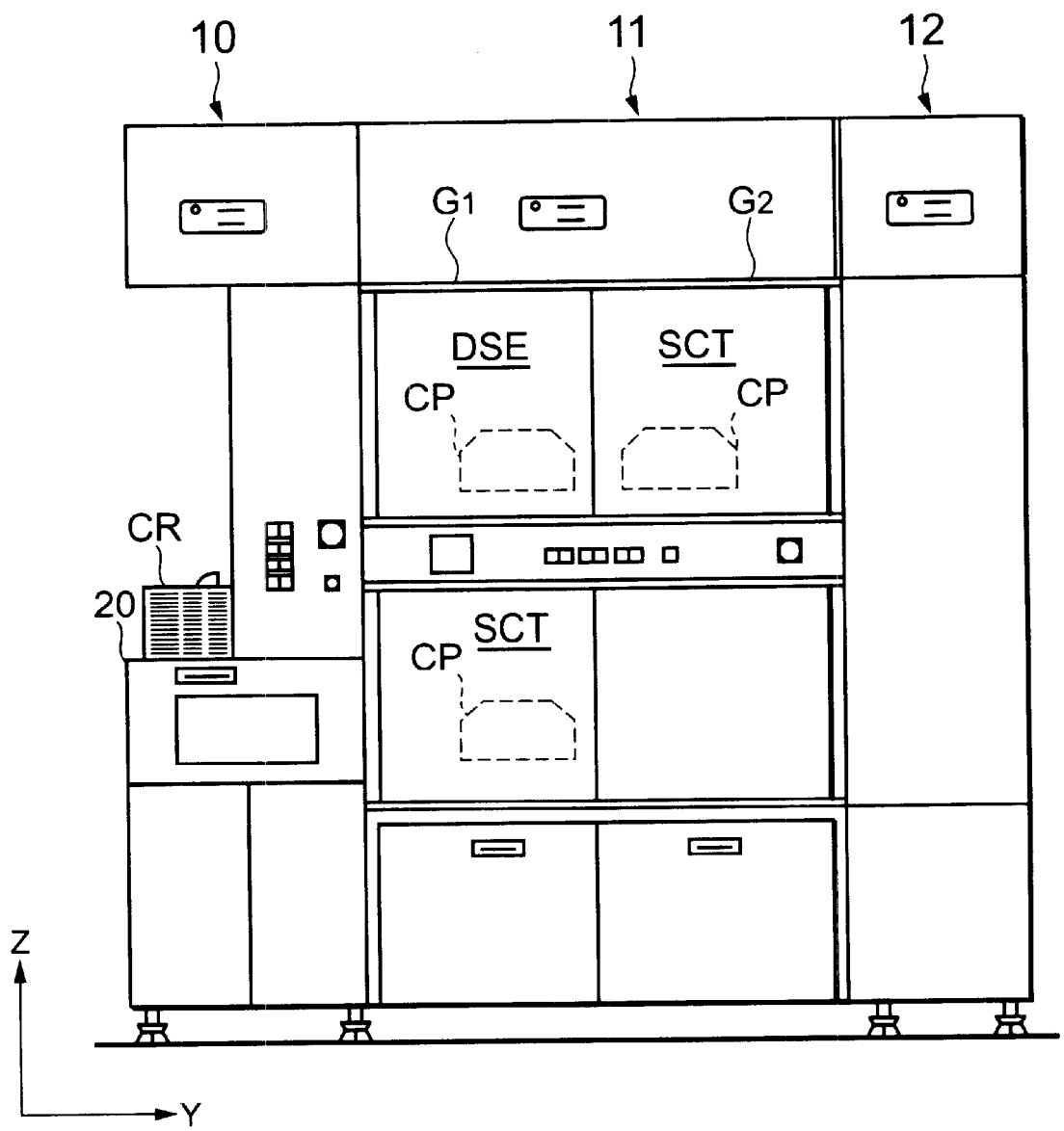
FIG. 2 is a front view of the SOD system shown in FIG. 1.
Figure 3:
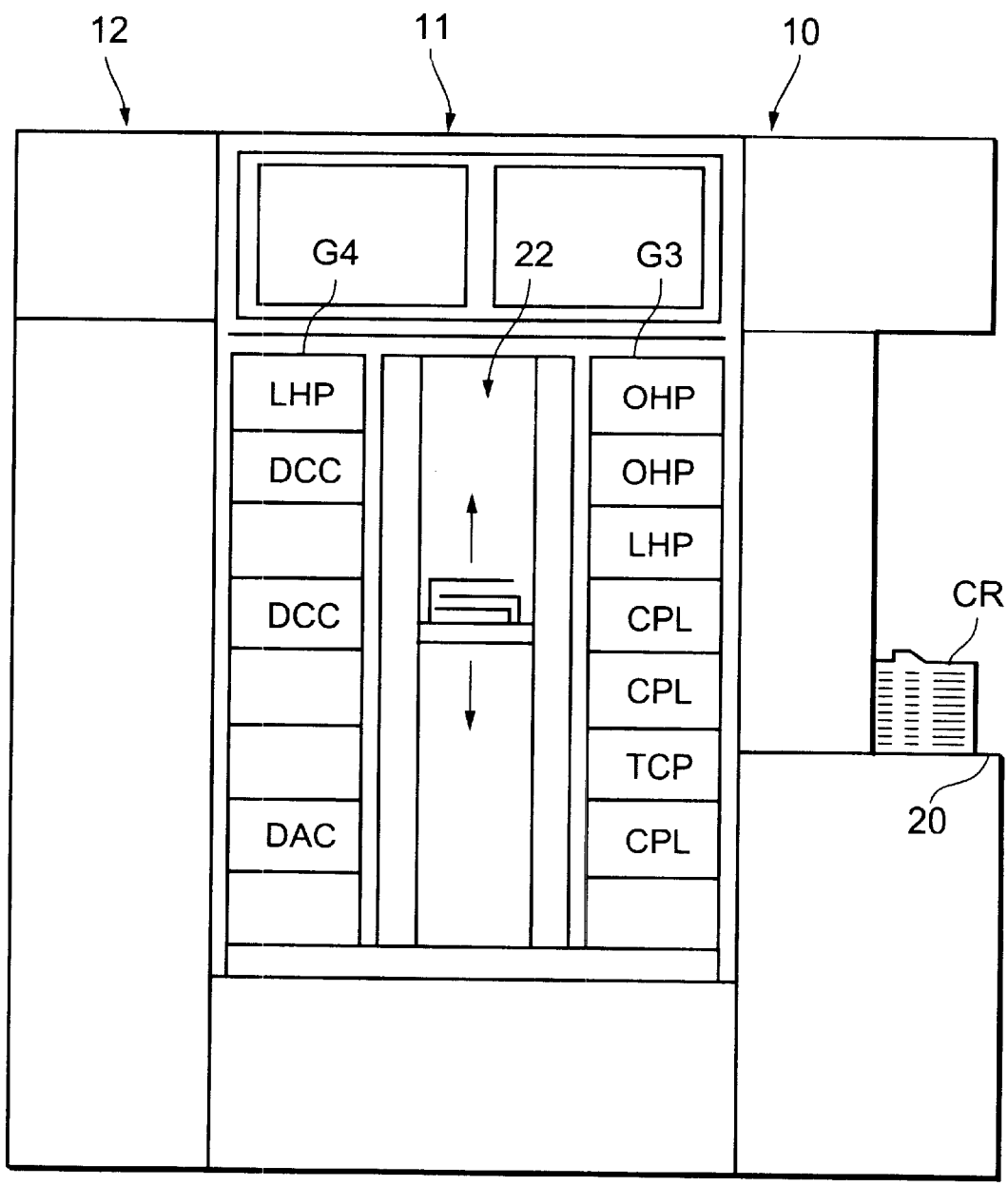
FIG. 3 is a rear view of the SOD system shown in FIG. 1.

FIG. 1 to FIG. 3 are views showing an entire constitution of an SOD system, FIG. 1 is a plan view, FIG. 2 is a front view, and FIG. 3 is a rear view. A substrate processing apparatus as a first embodiment of this invention is used as a heat processing chamber of DCC being a part of the SOD system.

An SOD system 1 is comprised of a cassette block 10 for carrying a plurality of, for example, 25 semiconductor wafers (hereinafter called the wafers) as substrates per a wafer cassette CR, as a unit, into or out of the system from or to an outside, and carrying the wafer W in and out of the wafer cassette CR, a processing block 11, and constituted by stacking various kinds of processing stations each for performing predetermined processing for the wafers W one by one in the SOD coating process at predetermined locations in multiple tiers, and a cabinet 12 in which a bottle of ammonia water, a bubbler, a drain bottle and the like necessary for an aging process step are being placed, are integrally connected.

In the cassette block 10, as shown in FIG. 1, a plurality of, for example, up to four cassettes CR are placed in a line in an X-direction with respective outlet and inlet ports for the wafer W facing the processing block 11 side at positions of projections 20a on a cassette mounting table 20. A wafer carrier 21 movable in the direction of arrangement of the cassettes (an X-direction) and in the direction of arrangement of the wafers housed in the wafer cassette CR (a Z-vertical direction) is structured to be selectively accessible to each of the wafer cassettes CR. Further, the wafer carrier device 21 is structured to be rotatable in a θ-direction so as to be accessible to a transfer and cooling plate (TCP) included in a multistage station section of a third group G3 at the processing block 11 side as will be described later.

In the aforementioned processing block 11, as shown in FIG. 1, a vertical carrier type of main wafer transfer mechanism 22 is provided in the center portion thereof, around which a pair of or a plurality of pairs of all processing stations are multi-tiered. In this embodiment, four groups G1, G2, G3, and G4 are arranged in multi tiers. The multi-tiered stations of the first and the second groups G1 and G2 are arranged on the front (the front in FIG. 1) side of the system, the multi-tiered stations of the third group G3 are arranged adjacent to the cassette block 10, and the multi-tiered stations of the fourth group G4 are arranged adjacent to the cabinet 12.

As shown in FIG. 2, in the first group G1, an SOD coating processing station (SCT) for supplying a insulation film material to the wafer W placed on a spin chuck and applying a uniform coating of insulation film onto the wafer by rotating the wafer in a cup CP, and a solvent exchange processing station (DSE) for supplying chemicals dissolved water for exchanging HMDS, heptane and the like, to the wafer W placed on the spin chuck in cup CP and performing process of exchanging a solvent in the insulation film applied to the wafer W to the other solvent before a drying step, are stacked in two tiers in the order from the bottom.

In the second group G2, the SOD coating processing station (SCT) are disposed on the upper tier. It is possible to place the SOD coating processing station (SCT), the solvent exchange processing station (DSE) and the like on the lower tiers of the second group G2 when necessary.

As shown in FIG. 3, in the third group G3, two low-oxygen high-temperature heat processing station (OHP), a low-temperature heat processing station (LHP), two cool processing stations (CPL), the transfer and cooling plate (TCP), and a cool processing station (CPL) are placed in multi-tiers in order from the top. The low-oxygen high-temperature heat processing station (OHP) has a heat plate portion for placing the wafer W thereon in a processing chamber which can be hermetically sealed, and while $N_2$ is uniformly discharged from a hole in the perimeter of the heat plate to be discharged from a center of an upper portion of the processing chamber, heat processing the wafer at a high temperature in a low-oxygen atmosphere. The low temperature heat processing station (LHP) has a heat plate for placing the wafer W thereon, and heat processing the wafer at a low temperature. The cool processing station (CPL) has a cooling plate for placing the wafer W thereon, and cool processing is performed for the wafer W. The transfer and cooling plate (TCP) has a two-tiered structure having a cooling plate for cooling the wafer W on the lower tier and a transfer table on the upper tier, and the wafer W is transferred to/from the cassette block 10 from/to the processing block 11.

In the fourth group G4, a low temperature heat processing station (LHP), two low-oxygen cure and cool processing stations (DCC), and an aging processing station (DAC) are placed in multi-tiers in the order from the top. The aging processing station (DAC) is for introducing $NH_3+H_2O$ into a processing chamber which can be hermetically sealed and performing aging processing for the wafer W to wet-gel the insulation film material film on the wafer W.

Figure 4:
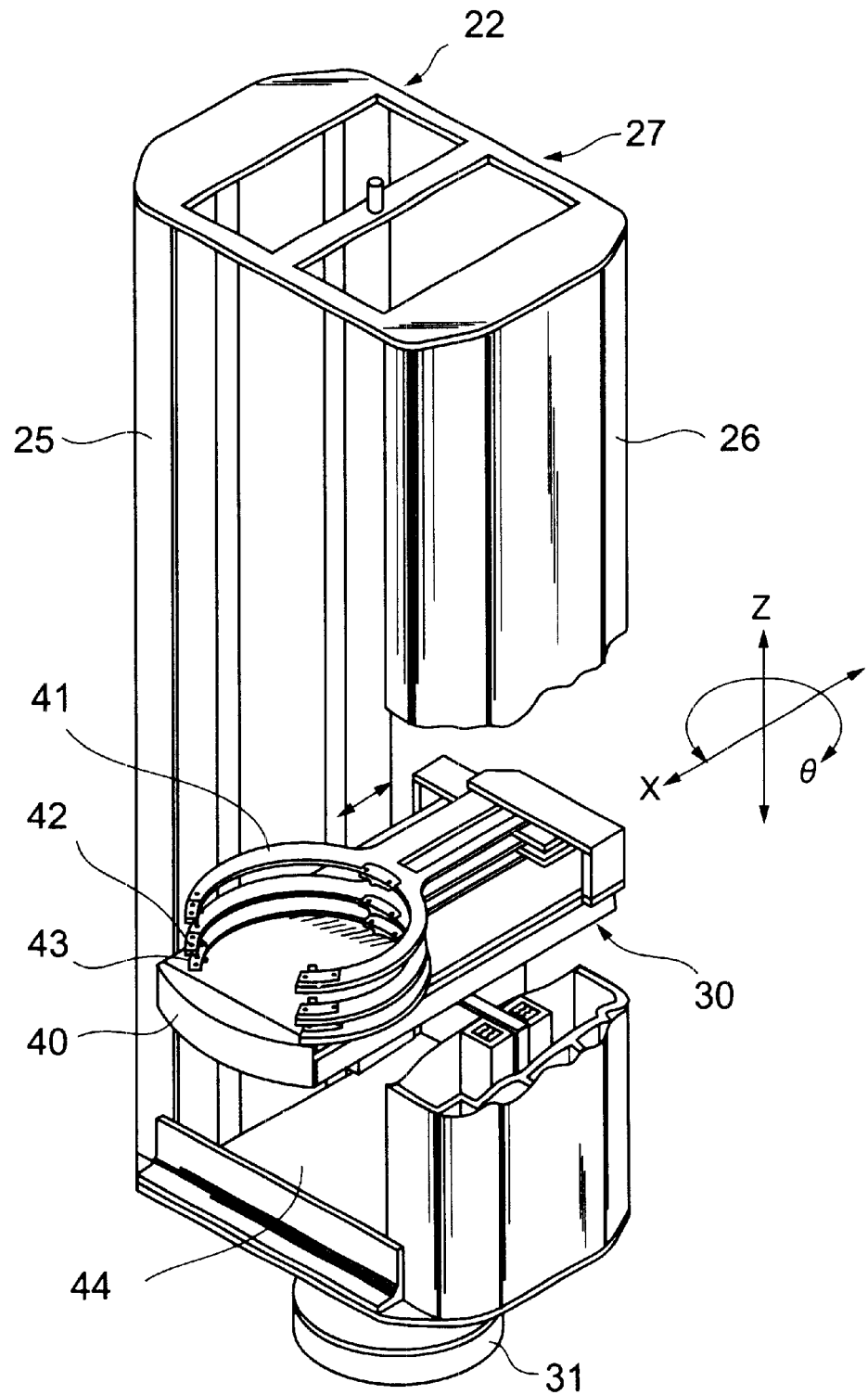
FIG. 4 is a perspective view of a main wafer transfer mechanism in the SOD system shown in FIG. 1.

FIG. 4 is a perspective view showing an appearance of a main wafer transfer mechanism 22. The main wafer transfer mechanism 22 is provided with a wafer transfer device 30 ascendable and descendable in the vertical direction (the Z-direction) inside a cylindrical supporter 27 composed of a pair of wall portions 25 and 26 connected to each other at each upper end and lower end to face each other. The cylindrical supporter 27 is connected to a rotating shaft of a motor 31, and rotated integrally with the wafer transfer device 30 around the rotating shaft by rotational driving force of the motor 31. Accordingly, the wafer transfer device 30 is rotatable in the θ-direction. For example, three tweezers are provided on a transfer base 40 of the wafer transfer device 30. These tweezers 41, 42, and 43 each have a shape and a size capable of passing through a side opening 44 between both the wall portions 25 and 26 of the cylindrical supporter 27, and are structured to be movable back and forth along the X-direction. The main wafer transfer mechanism 22 allows the tweezers 41, 42 and 43 to access the processing stations disposed around it to transfer the wafer W to/from the processing stations.

Figure 5:
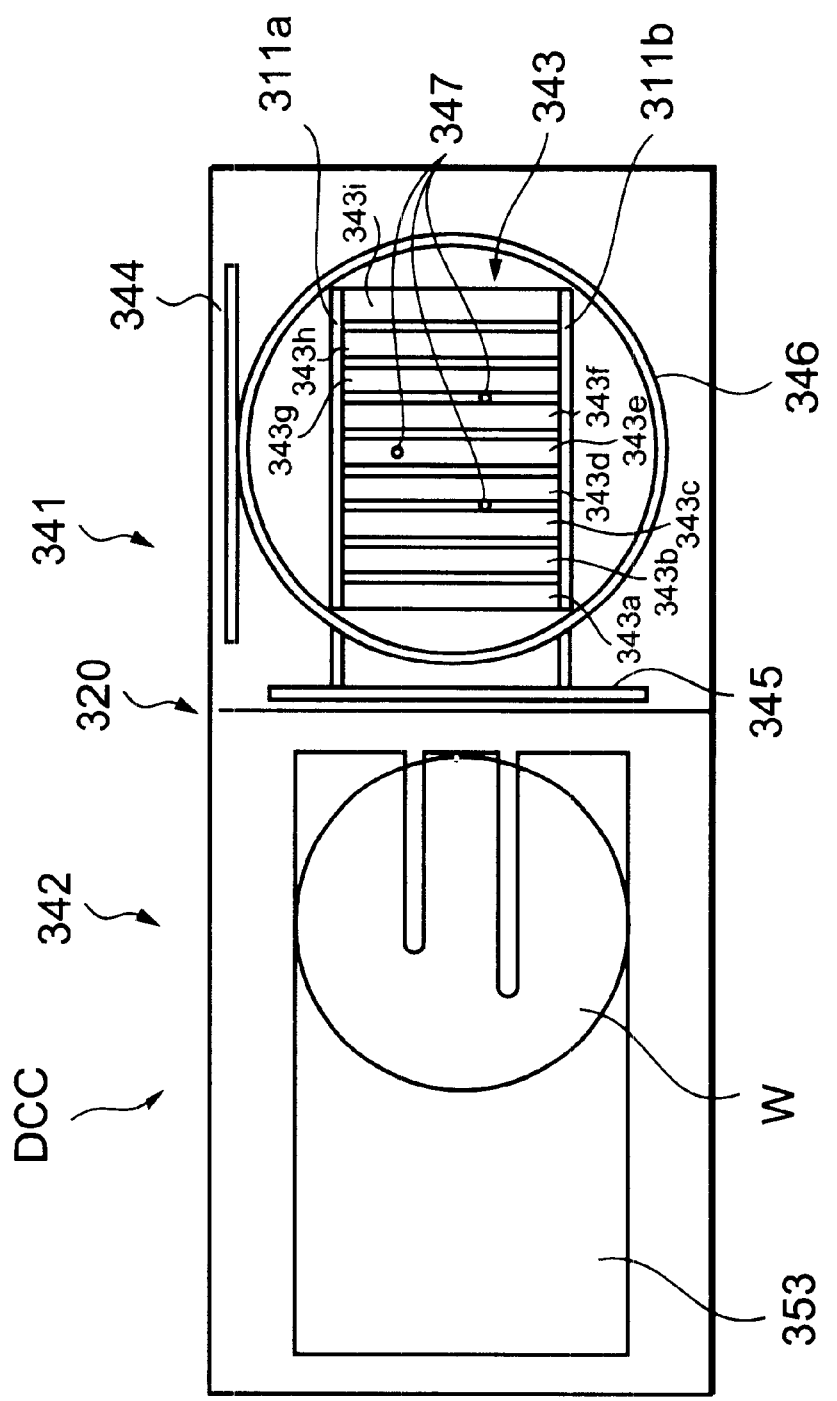
FIG. 5 is a plan view of a low-oxygen cure and cool processing station according to the first embodiment of the invention.
Figure 6:
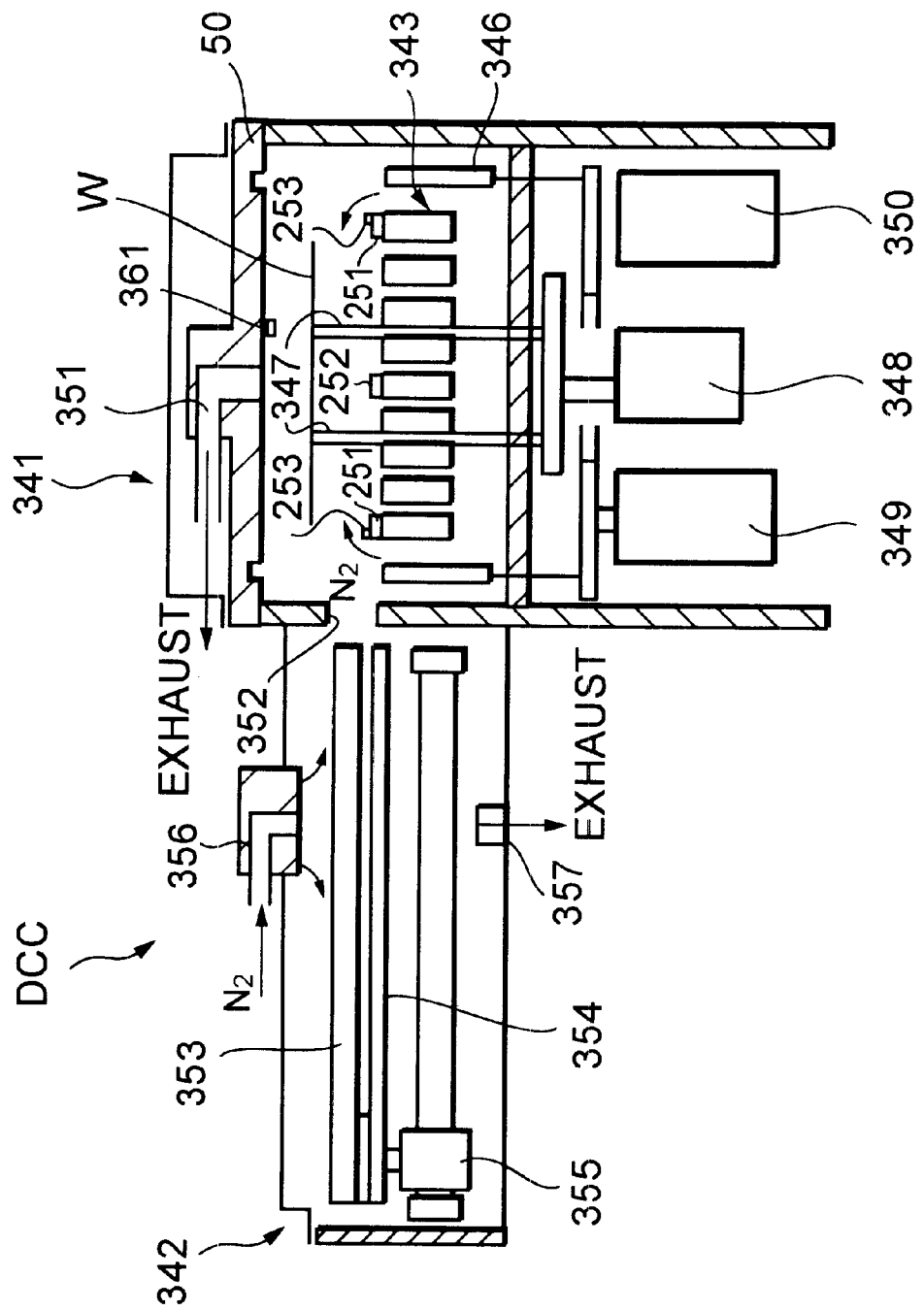
FIG. 6 is a sectional view of the low-oxygen cure and cool processing station shown in FIG. 5.
Figure 7:
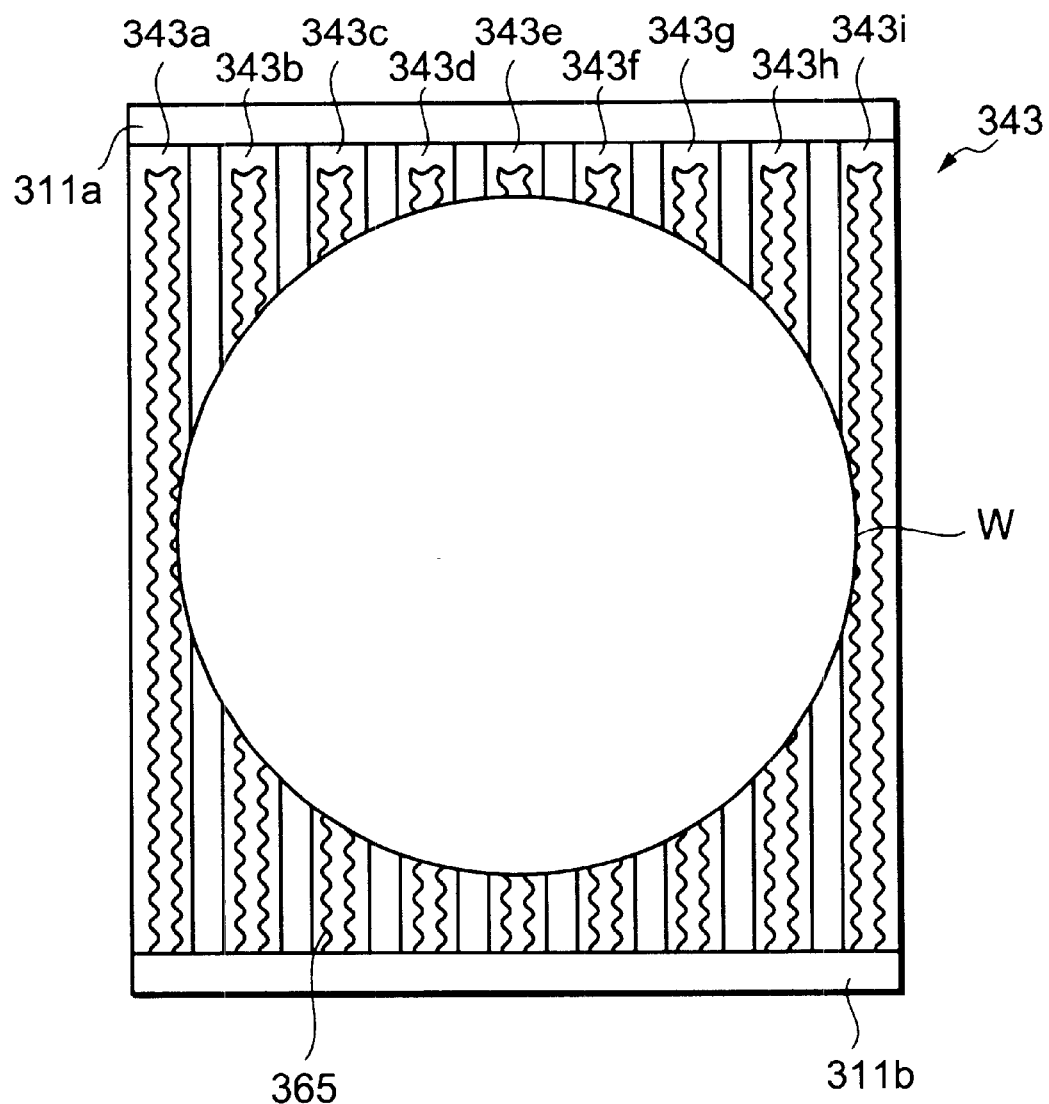
FIG. 7 is a schematic plan view of a plate placed in the low-oxygen cure and cool processing station shown in FIG. 5.

Next, the low-oxygen cure and cool processing station (DCC) will be explained with reference to FIG. 5 to FIG. 7. FIG. 5 is a plan view of the above-described low-oxygen cure and cool processing station (DCC), and FIG. 6 is a sectional view thereof. FIG. 7 is a schematic plan view of a plate portion disposed in the heat processing chamber of the DCC.

The low-oxygen cure and cool processing station (DCC) has a heat processing chamber 341 and a cool processing chamber 342 provided adjacently thereto. The heat processing chamber 341 has a plate portion 343 capable of having its temperature set at 200° C. to 470° C. In this embodiment, the wafer W is heated, for example, to 400° C. in the heat processing chamber 341 of the DCC. The low-oxygen cure and cool processing station (DCC) has a first gate shutter 344 opened and closed when the wafer W is transferred to and from the main wafer transfer mechanism 22, a second gate shutter 345 for opening and closing the space between the heat processing chamber 341 and the cool processing chamber 342, and a ring shutter 346 raised and lowered with the second gate shutter 345 while enclosing the wafer W around the plate portion 343. Further, the plate portion 343 is provided with three lift pins 347 to be ascendable and descendable for placing, and raising and lowering the wafer W thereon. A masking shield screen may be provided between the plate portion 343 and the ring shutter 346.

The plate portion 343 is divided in a rectangular shape into a plurality of divided plates 343a to 343i, and separated, each of which is supported by support plates 311a and 311b at its end portions. A heater 365 is incorporated in each of the divided plates 343a to 343i. As a result that the plate portion 343 is formed by placing a plurality of divided plates 343a to 343i, stresses caused by expansion and shrinking of the plate due to a drastic change in temperature can be spread over each divided plate 343a to 343i as compared with a case in which the plate portion 343 is being a sheet of plate. Further, by giving a space between the adjacent divided plates, heat expansion of the divided plates can be absorbed in the space. Consequently, cracking hardly occurs at the plate portion 343, thus increasing durability of the plate portion 343. In addition, the divided plates are placed so that the space between the divided plates adjacent to each other is 5 mm or less, 2 mm to 3 mm or less in this embodiment. As a result that the space is 5 mm or less, preferably 2 mm to 3 mm or less, the portion of the wafer W which does not correspond to the divided plates, specifically the portion to which the heater is not applied, is heated sufficiently, and uneven heating on the surface of the wafer W can be prevented from occurring.

In a lower part of the heat processing chamber 341, provided are a raising and lowering mechanism 348 for raising and lowering the three lift pins 347, a raising and lowering mechanism 349 for raising and lowering the ring shutter 346 with the second gate shutter 345, and a raising and lowering mechanism 350 for raising and lowering the first gate shutter 344 to open and close it. In this embodiment, one of the lift pins 347 penetrates the divided plate 343e, and the other lift pins 347 are located at a space between the adjacent divided plates.

An $N_2$ gas is supplied into the heat processing chamber 341 as a purging gas from an area under the wafer W, and the supplied $N_2$ gas flows toward a center portion of the wafer W from a periphery portion of the wafer W. An exhaust pipe 351 is connected to a top portion of the heat processing chamber 341, and the heat processing chamber 341 is structured so that the air therein is exhausted through the exhaust pipe 351. Further, an oxygen concentration monitor section 361 for monitoring the oxygen concentration inside the heat processing chamber 341 is connected to the heat processing chamber 341. As described later, by exhausting air while $N_2$ gas is supplied, the inside of the heat processing chamber 341 is maintained in a low oxygen concentration (for example, equal to or less than 50 ppm) atmosphere. The oxygen concentration monitor section may be designed to be placed on an exhaust path such as the exhaust pipe and the like.

The heat processing chamber 341 and the cool processing chamber 342 are connected with each other through a transferring port 352, and a cooling plate 353 for placing the wafer W and cooling it thereon is structured to be horizontally movable along a guide plate 354 by a moving mechanism 355. As a result, the cooling plate 353 can enter the heat processing chamber 341 via the transferring port 352, and it receives the wafer W heated by the plate portion 343 in the heat processing chamber 341 from the lift pins 347 and transfers it into the cool processing chamber 342. After the wafer W is cooled, it returns the wafer W onto the lift pins 347.

The set temperature of the cooling plate 353 is, for example, 15° C. to 25° C., and the suitable temperature range of the wafer W to be cooled is, for example, 200° C. to 470° C.

Further, the cool processing chamber 342 is structured to be supplied with an inert gas such as N₂ therein via a supply pipe 356. It is further structured so that the air inside thereof is exhausted to the outside via an exhaust pipe 357. As a result, the inside of the cool processing chamber 342 is maintained under a low oxygen concentration (for example, not more than 50 ppm) atmosphere as in the heat processing chamber 341.

A proximity sheet 251 and a proximity pin 252 each with a height of 0.2 mm, and a leading guide 253 are provided on the plate portion 343. As a result, an air is not left in a gap between the wafer W and the plate portion 343 when the replacement with N₂ gas is performed, and thus the time taken to make the inside of the heat processing chamber 341 under a desired low-oxygen atmosphere can be reduced, thus making it possible to perform heat processing in a low-oxygen state in a short time.

Next, the operation in the SOD system 1 structured as above will be explained, and the processing performed in the DCC will be particularly explained in detail.

First of all, in the cassette block 10, the unprocessed wafer W is transferred from the wafer cassette CR to a transfer table in the transfer and cooling plate (TCP) included in the third group G3 on the processing block 11 side by the wafer carrier 21.

The wafer W transferred to the transfer table in the transfer and cooling plate (TCP) is transferred to the cool processing station (CPL) by the main wafer transfer mechanism 22. In the cool processing station (CPL), the wafer W is cooled to a temperature suitable for the process in the SOD coating processing station (SCT).

The wafer W cooled in the cool processing station (CPL) is transferred to the SOD coating processing station (SCT) via the main wafer transfer mechanism 22. In the SOD coating processing station (SCT), the wafer W is coated with an insulation film material, for example, a solution in which colloids of TEOS (tetraethoxysilane) are dispersed in an organic solvent.

The wafer W for which the insulation film material coating process is performed in the SOD coating processing station is transferred to the aging processing station (DAC) via the main wafer transfer mechanism 22. In the aging processing station (DAC), NH₃+H₂O is introduced into the processing chamber to perform aging process for the wafer W, whereby the insulation film material film on the wafer W is gelled.

The wafer W after being subjected to the aging process in the aging processing station (DAC) is transferred to the solvent exchange processing station (DSE) via the main wafer transfer mechanism 22. In the solvent exchange processing station (DSE), the wafer W is supplied with a chemicals dissolved water for exchange, and process for replacing the solvent in the insulation film applied on the wafer W with the other solvent is performed.

The wafer W subjected to the replacement process in the solvent exchange processing station (DSE) is transferred to the low temperature heat processing station (LHP) via the main wafer transfer mechanism 22. In the low-temperature heat processing station (LHP), the wafer W is subjected to low temperature heat processing.

The wafer W after the low temperature heat processing in the law temperature heat processing station (LHP) is trans-ferred to the low-oxygen high-temperature heat processing station (OHP) via the main wafer transfer mechanism 22. In the low-oxygen high-temperature heat processing station (OHP), the wafer W is subjected to high temperature heat processing under an atmosphere reduced in oxygen. Alternatively, the wafer W after being subjected to the low temperature heat processing in the low temperature heat processing station (LHP) is transferred to the low-oxygen cure and cool processing station (DCC) via the main wafer transfer mechanism 22.

In the low-oxygen cure and cool processing station (DCC), with the state that first gate shutter 344 and the ring shutter 346 being raised and the lift pins 347 being raised, the wafer W is transferred onto the lift pins 347 in the heat processing chamber 341 from the main wafer transfer mechanism 22. At this stage, an outside air enters the heat processing chamber 341, and thus the temperature of the inside of the heat processing chamber 341 is lowered by about 100° C. to 200° C. from the temperature of 400° C. at the heat processing. In this embodiment, the plate portion 343 is formed by placing a plurality of divided plates 343a to 343i each with a space therebetween, thus making the plate portion 343 hard to break even if it repeatedly expands and shrinks due to such a drastic change in temperature. Thereafter, the first and second gate shutters 344 and 345, and the ring shutter 346 are closed. N₂ gas is supplied into the heat processing chamber 341 from an N₂ gas supply source, and the air inside the heat processing chamber 341 is exhausted via the exhaust pipe 351. At this stage, a large amount of N₂ gas of about 30l per minute is supplied. Thereby, air remaining in the heat processing chamber 341 is forced out through the exhaust pipe 351, whereby purge is promptly proceeded.

From the above situation, the lift pins 347 are lowered to place the wafer W on the plate portion 343 via the proximity sheet and the proximity pin. Thereafter, when the oxygen concentration is stabilized to be a fixed value or less, the amount of supply of N₂ gas is reduced to be as small as about 10l per minute, and from this time on, this amount of N₂ gas continues to be supplied. The wafer W is subjected to high temperature heat processing at 400° C. under such a low-oxygen atmosphere.

After the heat processing, the lift pins 347 rise, and the second gate shutter 345 and the ring shutter 346 rise. Thereafter, the cooling plate 353 enters the heat processing chamber 341 via the transferring port 352 along the guide plate 354 by the moving mechanism 355. The cooling plate 353 receives the wafer W heated by the plate portion 343 from the lift pins 347 to carry it into the cool processing chamber 342, and after the wafer W is cooled, it returns the wafer W to the lift pins 347. The cooling plate 353 is set at a temperature of, for example, 15° C. to 25° C. When the wafer W is transferred to/from the heat processing chamber 341 from/to the cool processing chamber 342, a low-temperature gas inside the cool processing chamber 342 flows into the heat processing chamber 341 as a result of the ascent of the second gate shutter 345 and the ring shutter 346, and the temperature inside the heat processing chamber 341 is reduced, but in this embodiment, the plate portion 343 does not crack easily even if the plate portion 343 repeatedly expands and shrinks due to such a drastic change in temperature.

The wafer W processed in the low-oxygen cure and cool processing station (DCC) is transferred to the cooling plate in the transfer and cooling plate (TCP) via the main wafer transfer mechanism 22. The wafer W is subjected to cool processing in the cooling plate in the transfer and cooling plate (TCP).

The wafer W subjected to the cool processing in the cooling plate in the transfer and cooling plate (TCP) is transferred to the wafer cassette CR via the wafer carrier 21 in the cassette block 10.

As described above, in the SOD system 1 of this embodiment, the plate portion is formed by a plurality of divided plates, and thereby the plate hardly cracks even if it is exposed to a sudden change in temperature in the heat processing chamber for heat-treating the wafer W, thus increasing durability. In the aforementioned embodiment, it is applied to the heat processing chamber in the low-oxygen cure and cool processing station (DCC), but it goes without saying that it is also applicable to other heat processing units.

Next, a substrate processing apparatus in a second embodiment will be explained. In the aforementioned first embodiment, the low-oxygen cure and cool processing station (DCC) has the structure in which the heat processing chamber and the cool processing chamber are connected to each other, but in the substrate processing apparatus in the second embodiment, it has a structure in which both heat processing and cool processing are performed in one processing chamber. The explanation will be made with use of FIG. 8 hereinafter. FIG. 8 is a schematic sectional view of a substrate processing apparatus 440 in the second embodiment, FIG. 8(a) shows a state in heat processing, and FIG. 8(b) shows a state in cool processing.

The substrate processing apparatus 440 includes a first plate portion 231 containing a heater and made of, for example, ceramics, a lower container 219 for supporting the first plate portion 231, a lid 220 in close contact with but in the same time separate from a periphery portion of the lower container 210 via a seal member 233 so as to form a space defined as a processing chamber with the lower container 219, a second plate portion 221 placed to face the first plate portion 231 via the wafer W, and three lift pins 235 for raising and lowering the wafer W between the first plate portion 231 and an upper position therefrom. Further, a supply port 242 for supplying $N_2$ gas to a higher position than the second plate portion 221 in the processing chamber, and a supply port 241 for supplying $N_2$ gas to a lower position than the second plate portion 221 in the processing chamber are formed in a side face portion of the lid 220, and an exhaust port 243 is formed in a side face portion opposing the supply ports 241 and 242. A supply port 240 for supplying $N_2$ gas to a lower position than the first plate portion 231 in the processing chamber is formed in a side face portion of the lower container 219. The first and the second plates portions 231 and 221 are divided into divided plates 221a to 221g, and 231a to 231g in a rectangular shape and separated as the plate portion in the aforementioned first embodiment. The divided plates adjacent to each other are disposed with spaces 222 and 232 of 2 mm to 3 mm from each other.

In the substrate processing apparatus 440, a proximity sheet 251 and a proximity pin 252 each as a gap forming member with a height of about 0.1 mm are provided, and a leading guide 253 is further provided.

Figure 8A:
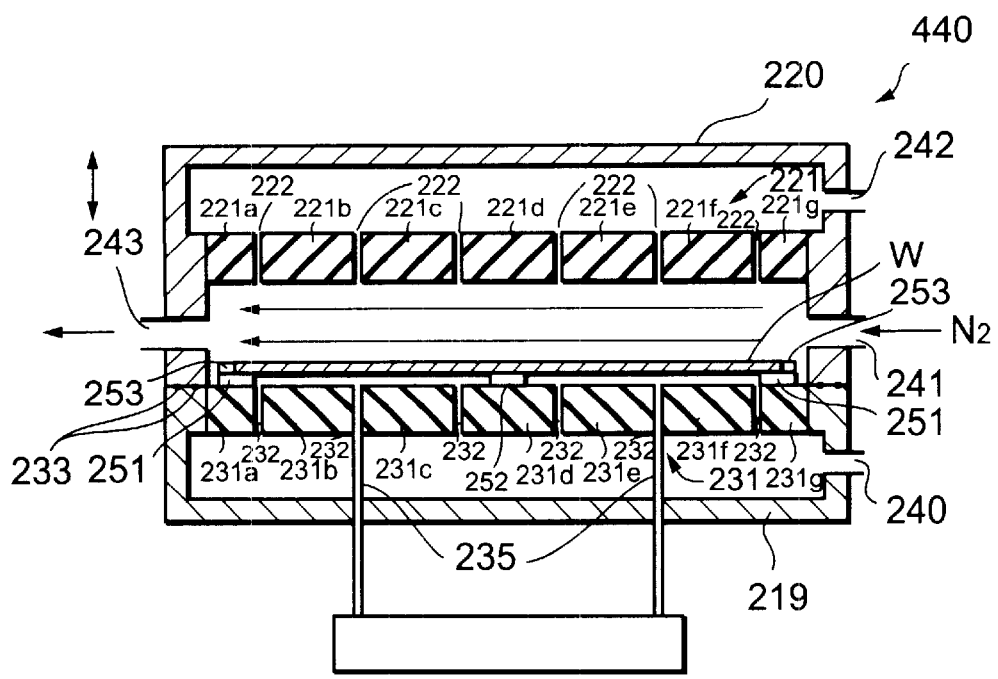
FIG. 8(a) shows a state in which a wafer W is heated.
Figure 8B:
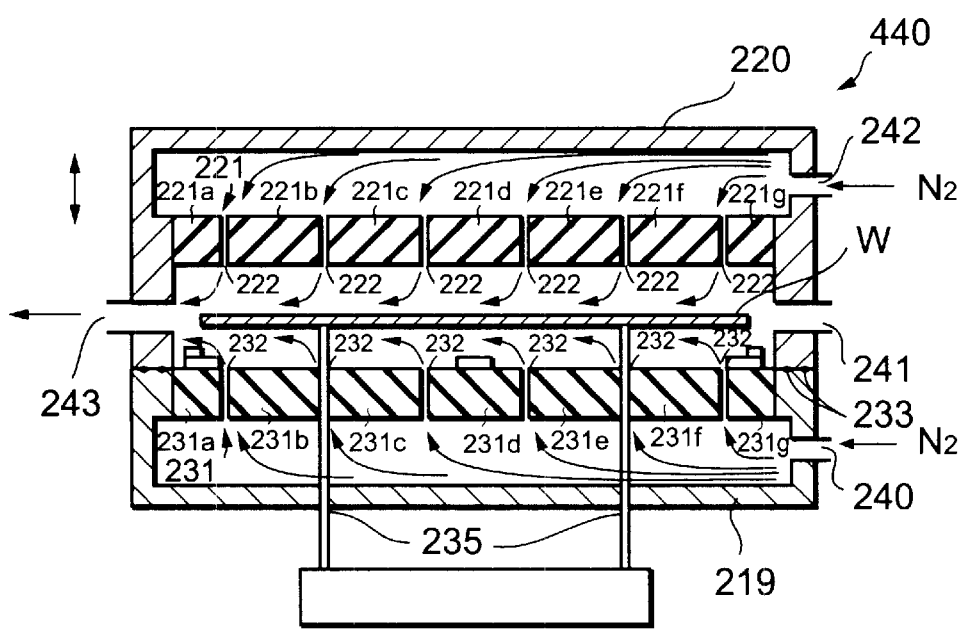
FIG. 8(b) shows a state in which the wafer W is cooled.

In the substrate processing apparatus 440, when the wafer W is subjected to heat processing, the lift pins 235 are lowered, and the wafer W is placed on the first plate portion 231 via the proximity sheet 251 and the proximity pin 252 as shown in FIG. 8(a). At this stage, the heater contained in the fist plate portion 231 is in a state in which a switch is turned on, and the first plate portion 231 is heated to, for example, 400° C. When the wafer W is heated, $N_2$ gas is supplied from the supply port 241 to exhaust the gas inside the processing chamber from the exhaust port 243 in order that the inside of the processing chamber is under a low-oxygen atmosphere. While heating, supply of the gas from the supply ports 242 and 240 is stopped, but the supply may be performed.

On the other hand, when the wafer W is subjected to cool processing, the wafer W is placed to be located in almost a center portion between the first plate portion 231 and the second plate portion 221 by the ascent of the lift pins 235 as shown in FIG. 8(b). $N_2$ gas is then supplied from the supply ports 240 and 242, and the $N_2$ gas is supplied to a top surface and an underside surface of the wafer W through the spaces 232 provided in the first plate portion 231 and the spaces 222 provided in the second plate portion 221, whereby the wafer W is cooled. The $N_2$ gas, which has passed through the spaces 222 and 232, passes through a space between the first plate portion 231 and the wafer W, and a space between the second plate portion 221 and the wafer W, and is exhausted from the exhaust port 243. Supply of $N_2$ gas from the supply port 241 is stopped while cooling, but the supply may be performed.

As described above, the first plate portion of the second embodiment is formed by a plurality of divided plates as the plate portion of the first embodiment, and therefore the plate is hard to crack even if it goes through a sudden change in temperature, thus increasing durability. Further, in the second embodiment, the spaces provided in the first plate portion are functioning as air space portions through which $N_2$ gas for cooling passes through. Accordingly, $N_2$ gas is supplied to the wafer W through the spaces evenly provided in the first plate portion, thus making it possible to cool the wafer W uniformly within the surface without unevenness. Further, by providing the second plate portion in addition to the first plate portion, the wafer W is placed between the two plate portions with predetermined spaces at the time of cooling, and thus cooling gas is supplied to both faces of the wafer W, thus making it possible to increase the cooling speed as compared with the case in which only the first plate portion is placed.

Figure 9:
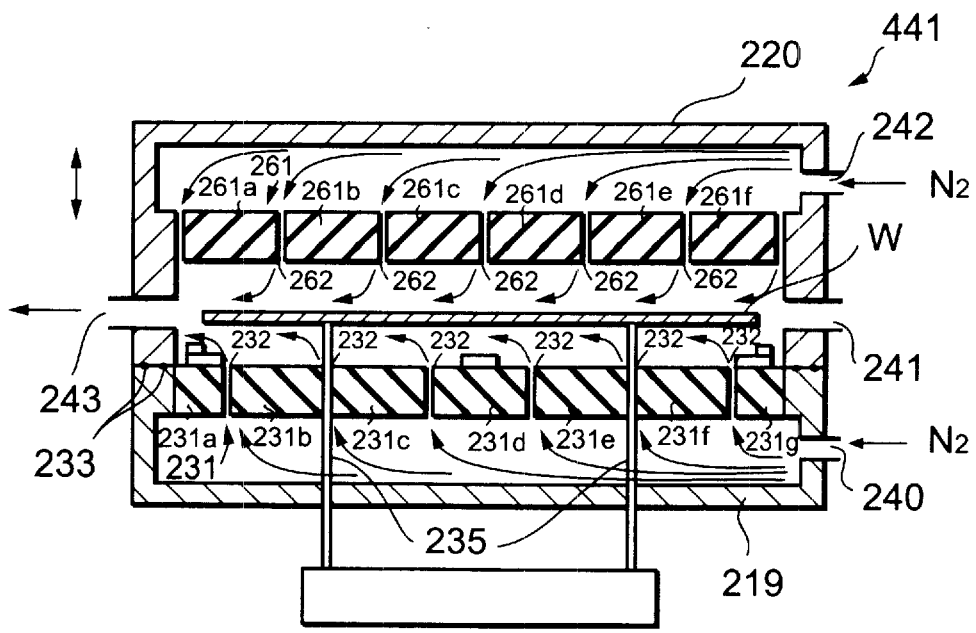
FIG. 9 is a modification example of the substrate processing apparatus in FIG. 8.

Further, in the second embodiment, the spaces 232 provided in the first plate portion 231 and the spaces 222 provided in the second plate portion 221 are formed so that the position of the spaces 232 and that of the spaces 222 correspond to each other when they are seen vertically from the top face of the substrate processing apparatus 440. In other words, this is the situation in which the projection of the spaces 232 provided in the first plate portion 231 being reflected on the wafer W and the projection of the spaces 222 provided in the second plate portion 221 being reflected on the wafer W corresponds with each other. However, it may be suitable to adjust the respective positions of the spaces of the plates so that the projection of the spaces 232 provided in the first plate portion 231 being reflected on the wafer W and the projection of the spaces 262 provided in the second plate portion 261 being reflected on the wafer W are shifted from each other as a substrate processing apparatus 441 shown in FIG. 9. Thereby, $N_2$ gas is supplied to the positions a little shifted from each other on the top surface and the underside surface of the wafer W, thus making it possible to apply cool processing to the wafer W more uniformly throughout the surface as compared with the substrate processing apparatus in FIG. 8. FIG. 9 is a schematic sectional view of the substrate processing apparatus 441 as a modification example of FIG. 8, and the same reference numerals and symbols are given to the same components as in the substrate processing apparatus 440 in FIG. 8.

Thus, in the second embodiment, different processes of cool processing and heat processing can be performed in the same processing space, thus making it possible to make the entire apparatus compact and reduce the space. In the second embodiment, both the heating and cool processing can be performed in one processing chamber, but only the cool processing may be performed.

Figure 10:
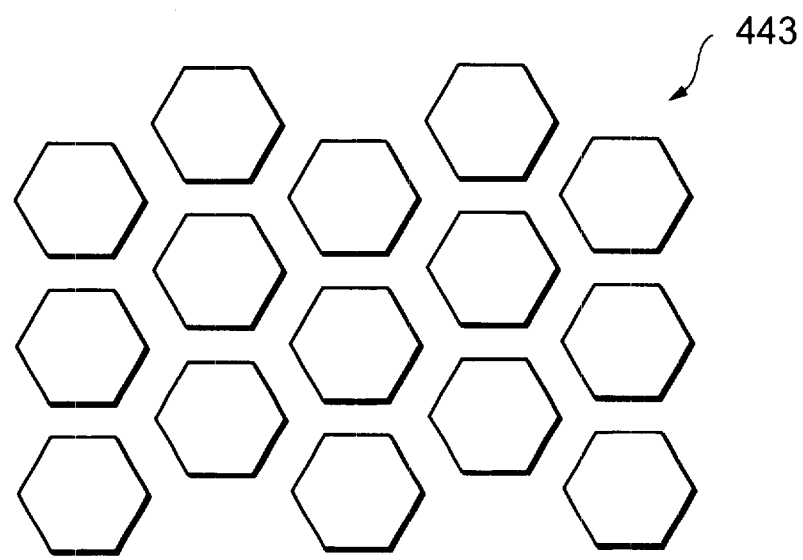
FIG. 10 is a schematic plan view showing a form of a plate of another embodiment.
Figure 11:
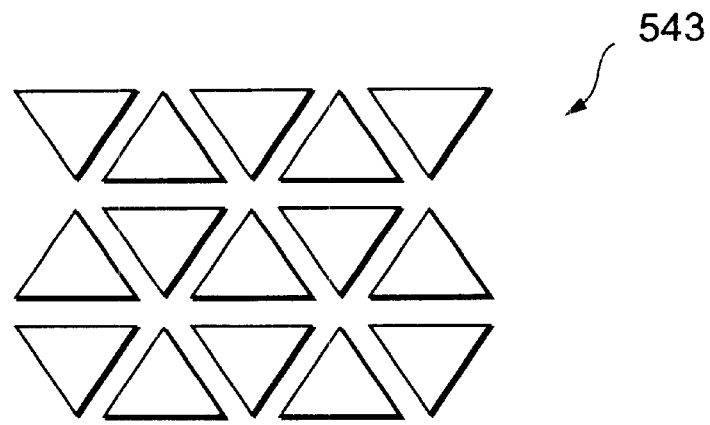
FIG. 11 is a schematic plan view showing a form of a plate of still another embodiment.
Figure 12:
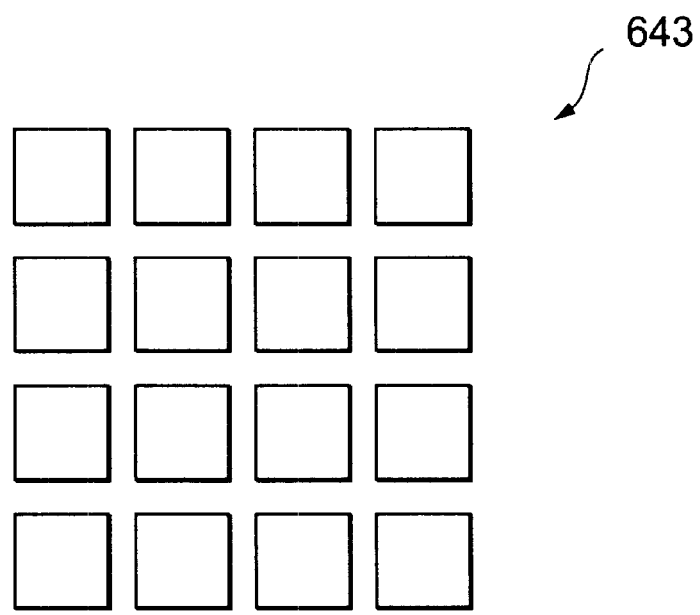
FIG. 12 is a schematic plan view showing a form of a plate of yet another embodiment.

Further, in the aforementioned embodiments, the plate, the first plate portion and the second plate portion (hereinafter called them the plate) are formed by a plurality of divided plates in a rectangular shape, but they are not limited to a rectangular shape, and they may be formed into, for example, a polygon. For example, as shown in FIG. 10, it may be suitable to form a plate portion 443 by a plurality of divided plates in a hexagonal shape. Further, as shown in FIG. 11, it may be suitable to form a plate portion 543 by a plurality of divided plates in a triangular shape. As shown in FIG. 12, the plate portion may be formed by a plurality of divided plates in a square shape. In this way, by further dividing the plate portion into smaller pieces, as compared with the aforementioned embodiments, gas is supplied to the entire surface of the wafer W during the cool processing shown in the second embodiment, thus making it possible to increase the cooling speed. In the aforementioned embodiments, a rectangular shape is employed, and therefore stress caused by expansion and shrink in a longitudinal direction in the plate surface is large, whereby stress tends to be unevenly exerted within the divided plate surface. On the other hand, the forms of the divided plates shown in FIG. 10 to FIG. 12 make the stress caused by expansion and shrink within each divided plate surface almost uniform, and therefore the plates are hard to break, thus increasing durability. Of the divided plates in FIG. 10 to FIG. 12, durability is further increased especially with the divided plates in a hexagonal form close to a circle.

Figure 13:
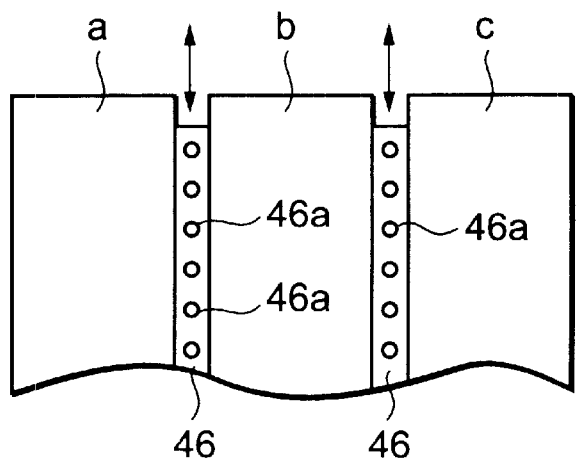
FIG. 13 is a plan view showing film members between divided plates.
Figure 14:
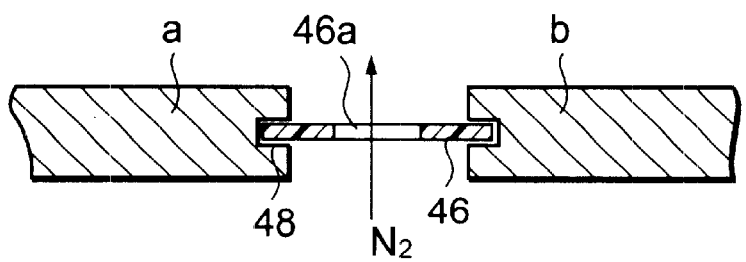
FIG. 14 is a sectional view of the film member shown in FIG. 13.

FIG. 13 and FIG. 14 are enlarged plan view and sectional view of divided plates portion of the substrate processing apparatus according to a third embodiment of the invention. In this embodiment, for example, a film member 46 is provided at spaces between divided plates a to c by being fitted in a recessed portions 48 of the plate portion to be attachable and detachable. A plurality of holes 46a for supplying $N_2$ gas from the underside of the plate portion to the top side of the plate portion therethrough are formed in the film member 46. For example, polyimide film is used as the film member 46.

According to the embodiment, for example, by preparing two or more film members with a plurality of holes 46a with different diameters and suitably replacing them, the supply amount of $N_2$ gas applied to the wafer can be controlled.

Figure 15:
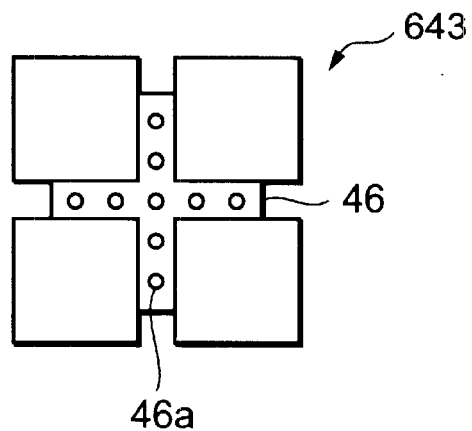
FIG. 15 is a plan view of a film member according to another embodiment.

Further, as shown in FIG. 15, this film member 46 may be provided attachably and detachably in each space of the divided plates in a square form shown in FIG. 12, for example.

Figure 16:
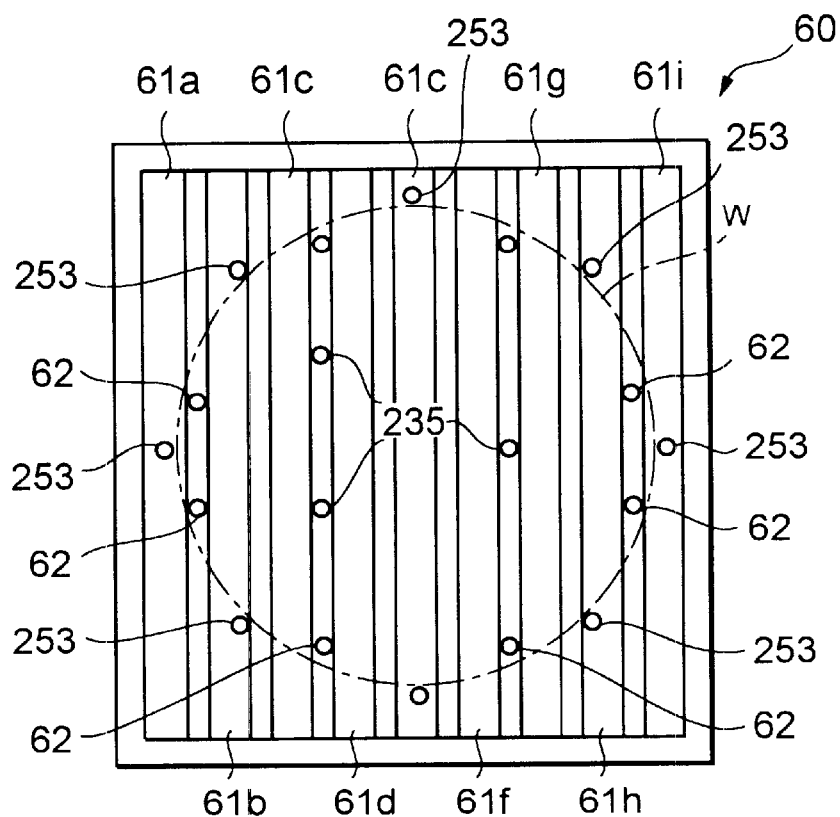
FIG. 16 is a plan view of a substrate processing apparatus according to a fourth embodiment of the invention.
Figure 17:
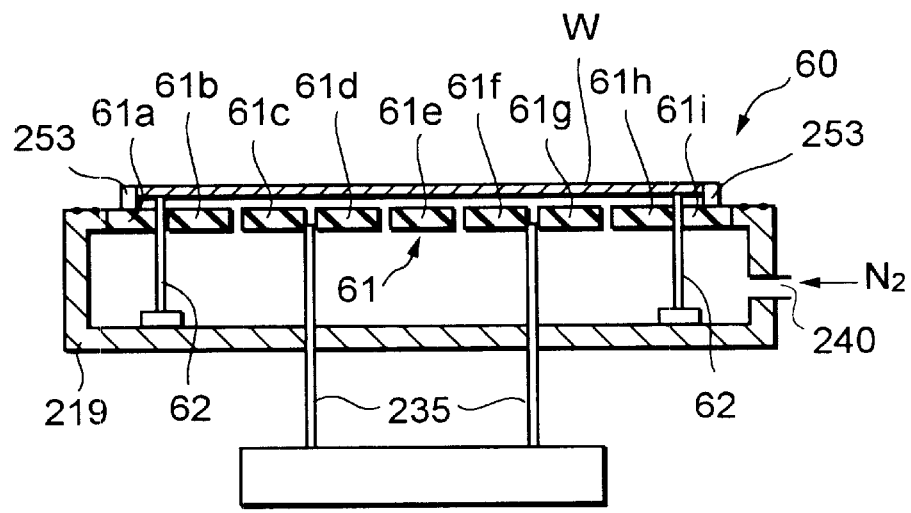
FIG. 17 is a sectional view of the substrate processing apparatus shown in FIG. 16.

FIG. 16 and FIG. 17 are a plan view and a sectional view of a substrate processing apparatus according to a fourth embodiment. A substrate processing apparatus 60 of this embodiment has a plate portion 61 divided into a rectangular shape as in each of the aforementioned embodiment. In this embodiment, instead of the proximity sheet 251, eight support pins 62 for supporting the wafer W with a predetermined space from a top surface of the plate portion 61 are provided, for example, at a periphery area of the wafer W. These support pins 62 are inserted through spaces between divided plates 61a to 61i and vertically provided at the lower container 219 for supporting the divided plate portion 61. Further, the leading guides 253 are directly fixed on the plate portion 61.

According to the fourth embodiment, the wafer W is supported by the support pins 62, and therefore the load of the wafer W is not exerted on the plate portion 61, thus making it possible to form the thickness of the plate portion 61 to be smaller than that of the plate portion in each of the aforementioned embodiments. In this embodiment, thickness of 0.5 mm to 2.0 mm can be achieved.

Further, as a result that the plate portion 61 is formed to be thinner, time taken to raise the temperature of the plate can be reduced, and thermal capacity can be decreased, thus contributing to energy conservation.

Further, when $N_2$ gas for cooling is supplied from the supply port 240 to cool the wafer W, $N_2$ gas is supplied to the wafer W through each space between the thin divided plates 61a to 61i, and therefore $N_2$ gas passes a shorter distance when it passes through the space of the thinner plate portion 61 according to this embodiment than a thick plate, thus making it possible to reduce the flow of $N_2$ gas, and contributing to energy conservation.

Figure 18:
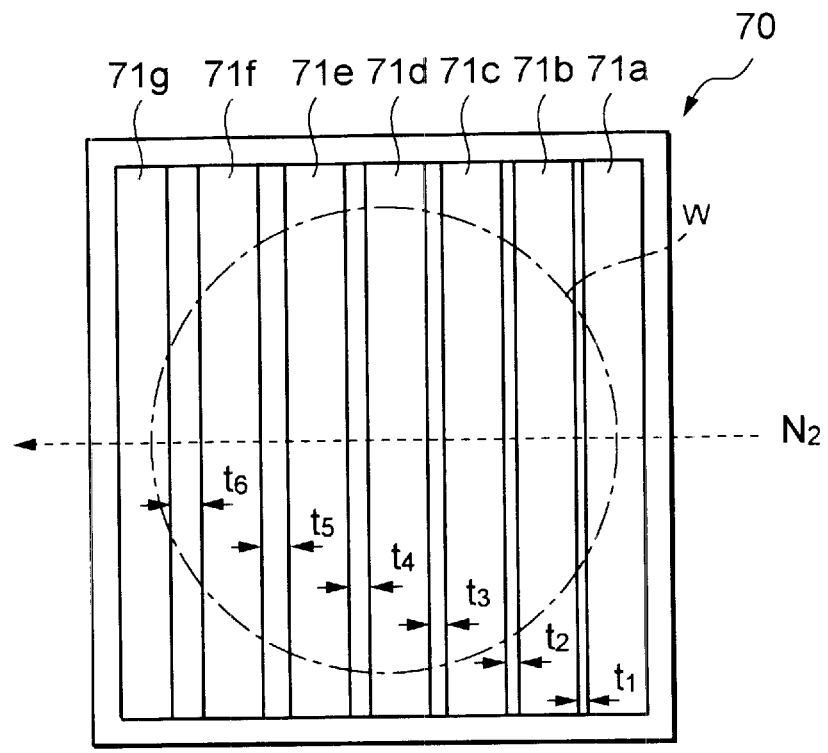
FIG. 18 is a plan view of a substrate processing apparatus according to a fifth embodiment of the invention.

FIG. 18 is a plan view of a substrate processing apparatus according to a fifth embodiment of the invention. A substrate processing apparatus 70 of this embodiment has divided plates 71a to 71g in a rectangular shape as in each of the aforementioned embodiments. The relationship between each of spaces t1, t2, t3, t4, t5, and t6 of the divided plates 71a to 71g is set to be t1<t2<t3<t4<t5<t6.

As in each of the aforementioned embodiments, when $N_2$ gas is supplied to the wafer W from the right side in FIG. 18, the temperature of the $N_2$ gas rises to an extent due to the heat from the plates 71a to 71g as the $N_2$ gas flows from upstream of the $N_2$ gas supply toward downstream. According to the fifth embodiment, however, each space is gradually form to be larger toward the divided plate 71g at downstream from the divided plate 71a at upstream, thus making it possible to increase the flow of the gas supplied to the wafer W toward downstream. Consequently, cool processing can be uniformly applied to the entire surface of the wafer W.

Figure 19:
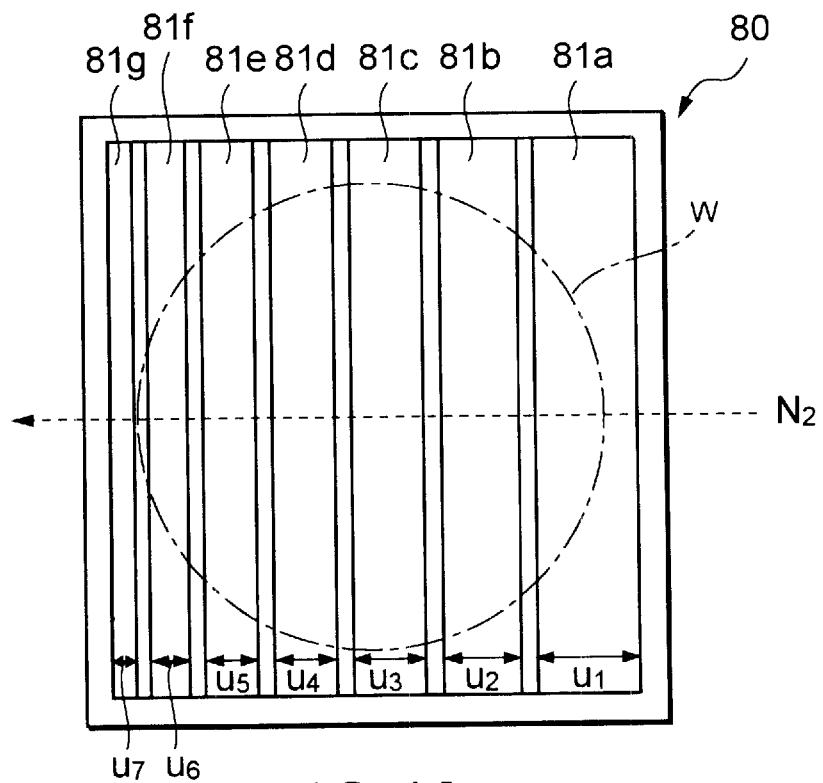
FIG. 19 is a plan view of a substrate processing apparatus according to a sixth embodiment of the invention.

FIG. 19 is a plan view of a substrate processing apparatus according to a sixth embodiment of the present invention. A substrate processing apparatus 80 of this embodiment has divided plates 81a to 81g in a rectangular shape, and the widths of the divided plates 81a to 81g are set to be u1>u2>u3>u4>u5>u6>u7 as shown in FIG. 19. Further, all the spaces between the respective adjacent divided plates 81a to 81g are the same.

According to the structure described above, the temperature of $N_2$ gas rises to an extent by heat from the plates 81a to 81g as the $N_2$ gas flows form an $N_2$ gas supply upstream toward downstream. However, according to this embodiment, the pitches of the spaces are formed to be gradually smaller toward the divided plate 81g at downstream from the divided plate 81a at upstream and thus the flow of the gas supplied to the wafer W can be made larger toward downstream. Accordingly, the same effect as that in the aforementioned fourth embodiment is provided.

Figure 20:
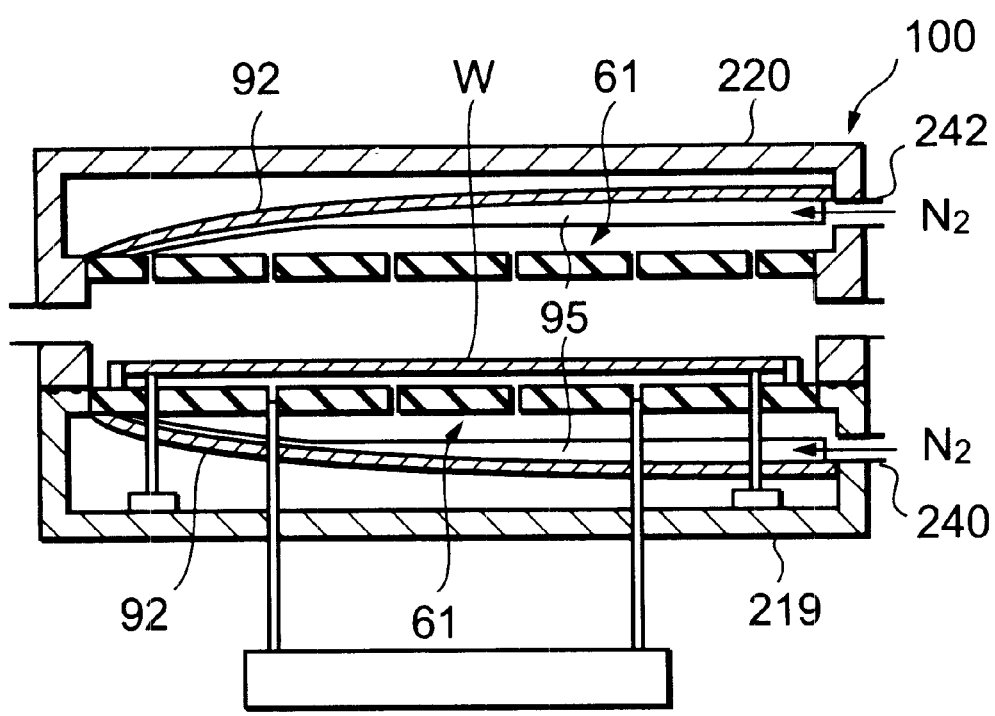
FIG. 20 is a sectional view of a substrate processing apparatus according to a seventh embodiment of the invention.

FIG. 20 is a sectional view of a substrate processing apparatus according to a seventh embodiment. In a substrate processing apparatus 100 of this embodiment, current plates 92 as a guiding member is placed inside the lid 220 and the lower container 219 so as to effectively guide $N_2$ gas from the supply ports 242 and 240 into a space from each divided plate portion 61. The current plate is inclined from upstream where $N_2$ gas is supplied toward downstream as shown in FIG. 19. Further, the current plates 92 are provided with guide blades 95 for rectifying the $N_2$ gas.

As a result that the current plates 92 are placed to approach the divided plate portion 61 toward downstream as described above, the flow of the $N_2$ gas supplied to the wafer W can be made larger toward downstream, though the temperature of the $N_2$ gas rises to an extent by the heat from the plate as the $N_2$ gas flows from upstream of the $N_2$ gas supply toward downstream. Accordingly, cool processing can be uniformly applied to the entire surface of the wafer W.

In addition, the spaces between the adjacent divided plates explained in each of the aforementioned embodiments are preferably 0.5 mm to 3 mm. When the spaces are made narrower than 0.5 mm, the adjacent divided plates contacts with each other due to the heat expansion thereof. This may cause cracking and breaking of the plate, therefore, it is better to make the space wider than 0.5 mm.

The present invention is not limited to the aforementioned embodiments, and various modifications can be made. For example, a substrate to be processed is not limited to a semiconductor wafer, and it may be other substrates such as an LCD substrate and the like. Further, the kind of film is not limited to a layer insulation film.

As explained thus far, according to the present invention, a plate with increased durability against a sudden change in temperature can be obtained. Further, cool processing can be applied to a substrate uniformly within its surface.

The disclosure of Japanese Patent Application No.2000-185118 filed Jun. 20, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A substrate processing apparatus, comprising:
    a plate portion having a plurality of divided plates holding a substrate; and
    a heater heat-processing the substrate held by said plate portion,
    wherein said plurality of divided plates are horizontally spaced from each other to create a plurality of spaces.
2. The apparatus as set forth in claim 1,
    wherein a space between adjacent plates in the plurality of divided plates is equal to or less than 5 mm.
3. The apparatus as set forth in claim 1,
    wherein a space between adjacent plates in the plurality of divided plates is equal to or less than 3 mm.
4. The apparatus as set forth in claim 1,
    wherein the divided plate has a rectangular shape.
5. The apparatus as set forth in claim 1,
    wherein the divided plate has a polygonal shape.
6. The apparatus as set forth in claim 1, further comprising:
    a film member disposed attachably and detachably in at least one of the plurality of spaces, the film member having a plurality of holes.
7. The apparatus as set forth in claim 1, wherein respective top surfaces of the plurality of divided plates are coplanar.
8. A substrate processing apparatus, comprising:
    a first plate portion having a plurality of horizontally divided and separated plates with a first space from each other and placed horizontally with a substrate, the first plate portion has a first surface and a second surface, the first surface holding the substrate;
    a first heater for heat-processing the substrate held by said first plate portion; and
    a gas supply mechanism supplying a first gas to the substrate through a first space between the adjacent divided plates of the first plate portion.
9. The apparatus as set forth in claim 8, further comprising:
    a second plate portion having a plurality of horizontally divided and separated plates with a second space from each other and placed horizontally with the substrate,
    wherein the second plate portion is provided so that the substrate is placed between the first plate portion and the second plate portion.
10. The apparatus as set forth in claim 9,
    wherein the first space is below the divided plates of the second plate portion and the space is above the divided plates of the first plate portion.
11. The apparatus as set forth in claim 9, further comprising:
    a second heater for heat-processing the substrate through the second plate portion.
12. The apparatus as set forth in claim 8, further comprising:
    a plurality of support members disposed so as to be inserted through the first space, holding the substrate with a predetermined space therefrom.
13. The apparatus as set forth in claim 12,
    wherein a thickness of said divided plates of the first plate portion is 0.5 mm to 2.0 mm.
14. The apparatus as set forth in claim 8,
    wherein the first space is formed to be gradually larger toward downstream compared to upstream where the first gas is supplied.
15. The apparatus as set forth in claim 8,
    wherein surface areas of the divided plates of the first plate portion are formed to be gradually smaller downstream compared to upstream where the first gas is supplied.
16. The apparatus as set forth in claim 8, further comprising:
    a guide member disposed at the second surface of the first plate portion, guiding the supplied first gas into the first space.
17. The apparatus as set forth in claim 16,
    wherein the guide member has a curving portion that gradually approaches the second surface of the first plate portion.
18. The apparatus as set forth in claim 8, wherein respective top surfaces of the plurality of divided and separated places are coplanar.
19. A substrate processing method, comprising:
    holding a substrate on a first plate portion having a plurality of divided plates creating a plurality of first spaces therebetween;
    heat-processing the substrate on the first plate portion;
    separating the substrate from the first plate portion; and
    supplying a first cooling gas to the separated substrate through the plurality of first spaces.
20. The method as set forth in claim 19, further comprising:
    supplying a second cooling gas to the separated substrate through second spaces, the second spaces being formed between divided plates of a second plate portion, the second plate portion being disposed to oppose the first plate portion with the substrate disposed therebetween.

* * * * *

UNITED STATES PATENT AND TRADEMARK OFFICE
CERTIFICATE OF CORRECTION

PATENT NO. : 6,644,964 B2
DATED : November 11, 2003
INVENTOR(S) : Eiichi Shirakawa et al.

It is certified that error appears in the above-identified patent and that said Letters Patent is hereby corrected as shown below:

<u>Column 14,</u>
Line 14, insert -- second -- between "the" (first occurrence) and "space";
Line 48, change "places" to -- plates --.

Signed and Sealed this

Twentieth Day of April, 2004

JON W. DUDAS
*Acting Director of the United States Patent and Trademark Office*